United States Patent [19]

Ishii et al.

[11] Patent Number: 4,894,695

[45] Date of Patent: Jan. 16, 1990

[54] SEMICONDUCTOR DEVICE WITH NO STRESS GENERATED AT THE TRENCH CORNER PORTION AND THE METHOD FOR MAKING THE SAME

[75] Inventors: Tatsuya Ishii; Yoshinori Okumura; Masao Nagatomo, all of Hyogo, Japan

[73] Assignee: Mitsubishi Denki Kabushiki Kaisha, Tokyo, Japan

[21] Appl. No.: 169,062

[22] Filed: Mar. 17, 1988

[30] Foreign Application Priority Data

Mar. 23, 1987 [JP] Japan .................................. 62-69431

[51] Int. Cl.[4] .................... H01L 29/78; H01L 29/06; H01L 27/12
[52] U.S. Cl. .................................. 357/23.6; 357/55; 357/49; 437/67
[58] Field of Search ..................... 357/23.6, 55; 437/67

[56] References Cited

U.S. PATENT DOCUMENTS 4,740,827  4/1988  Niitsu et al. .................... 357/55
4,751,557  6/1988  Sunami et al. ................... 357/55

FOREIGN PATENT DOCUMENTS 234067  10/1986  Japan ......................... 357/23.6

Primary Examiner—Rolf Hille
Assistant Examiner—Robert P. Limanek
Attorney, Agent, or Firm—Lowe, Price, LeBlanc, Becker & Shur

[57] ABSTRACT

The semiconductor device in which no stress occurs at the corner portion of the trench comprises a p type semiconductor substrate having a trench and a main surface, a thick insulating film formed on the bottom portion of the trench, a thin insulating film formed on the sidewall portion of the trench and connected to the end portion of the thick insulating film, and an n type impurity region formed in the semiconductor substrate only on the side portion of the thin insulating film.

14 Claims, 11 Drawing Sheets

SEMICONDUCTOR DEVICE WITH NO STRESS GENERATED AT THE TRENCH CORNER PORTION AND THE METHOD FOR MAKING THE SAME

BACKGROUND OF THE INVENTION

1. Field of the Invention

The present invention relates generally to a semiconductor device and, more specifically, it relates to a semiconductor device formed on a semiconductor substrate with a trench, in which the generation of the stress can be prevented at the corner portion where the bottom surface and the sidewall surfaces of the trench intersect with each other.

2. Description of the Prior Art

A dynamic type semiconductor memory device is an example of the semiconductor device formed on a semiconductor substrate with a trench. In the following, the description will be made of this dynamic type semiconductor memory device as an example.

The dynamic type semiconductor memory device has been well known. FIG. 1 is a block diagram showing the whole structure of such conventional dynamic type semiconductor memory device.

Referring to FIG. 1, the dynamic type semiconductor memory device comprises an array including a plurality of memory cells serving as a memory portion, a X decoder and a Y decoder for selecting the address, and input/output interface portion including a sense amplifier connected to an input/output buffer. Each of the memory cells is connected to each intersection of a word line connected to the X decoder and a bit line connected to the Y decoder, with the word line and the bit line constituting a matrix. The said array is thus structured.

The operation will be hereinafter described. Upon receipt of externally applied row address signal and column address signal, a memory cell is selected which is at the intersection of one word line and one bit line selected by the X decoder and the Y decoder, and the information is read from or written to the memory cell through the input/output interface portion including the sense amplifier and through the input/output buffer.

FIG. 2 is a cross sectional view of the above described one memory cell. The memory cell comprises a capacitor for storing information carrying charge and a transistor for reading and writing the information carrying charge.

Referring to FIG. 2, the capacitor comprises an impurity diffusion layer 8 formed on the sidewalls of the trench 25 of the semiconductor substrate with a trench 25, and a capacitor plate electrode 10 formed thereon with a dielectric film 9 interposed therebetween. The transistor comprises impurity diffusion layers 13a and 13b formed on a main surface of the semiconductor substrate 1 spaced apart from each other and a transfer gate electrode 12 (word line) formed on that portion of the main surface of the semiconductor substrate which is sandwiched by the impurity diffusion layers 13a and 13b (channel region 26) with an insulating film interposed therebetween. The adjacent two memory cells are separated from each other by a region 6 for isolation between devices formed on the bottom portion of the trench 25. The impurity diffusion layer 13a is connected to an impurity diffusion layer 8 of the capacitor formed on the sidewalls of the trench 25 of the semiconductor substrate. The impurity diffusion layer 13b is connected to an aluminum wiring 15 which is to be the bit line. The bit line is separated from the word line or the like by an interlayer insulating film 14. A surface protection film 16 is formed on the bit line.

The data writing/reading operation of the memory cell will be described with reference to FIG. 2. In writing data, when a prescribed potential is applied to the word line 12, an inversion layer is formed in the channel region 26, so that the channel region 26 becomes conductive. Therefore, the charge from the bit line 15 is stored in the impurity diffusion layer 8 through the channel region 26. On the contrary, in reading data, the charge stored in the impurity diffusion layer 8 is taken out through the channel region 26 which is inverted by the application of a prescribed potential on the word line 12 and through the impurity diffusion layers 13a and 13b and the bit line 15.

The method for making a trench in a conventional semiconductor memory device shown in FIG. 2 is disclosed in, for example, "Peripheral Capacitor Cell with Fully Recessed Isolation for Megabit DRAM" K. Tsukamoto et al, Extended Abstracts of the 18th Conference on Solid State Devices and Material, 1986. FIGS. 3A to 3C are cross sectional views showing the method for making the trench disclosed therein step by step.

First, a trench 25 is formed on the semiconductor substrate 1. The portion where the bottom surface 25a and a sidewall surfaces 25b of the trench 25 intersect is processed to have a right angle (FIG. 3A).

Thereafter, a silicon oxide film 2 and a silicon nitride film 3 are formed on the main surface of the substrate 1 and on the sidewall surface 25b of the trench 25 so as to form a selective oxide film on the bottom surface 25a of the trench 25 (FIG. 3B).

The substrate is oxidized and a region 6 for isolation between devices is formed on the bottom portion of the trench 25. The silicon oxide film 2 and the silicon nitride film 3 are removed. An impurity diffusion layer 8 is formed on the sidewall surface 25b of the trench 25 and the flap surface portion by ion implantation method and the like (FIG. 3C).

Referring to FIG. 3C, a bird's beak 6a is formed at the end portion of the region for isolation between devices. The bird's beak 6a extends, with the direction of the extension changed from horizontal to vertical at the corner portion of the trench 25. Thereafter capacitor plate electrodes and so on are formed. Consequently, a trench type memory cell such as shown in FIG. 2 is provided.

As shown in FIG. 3A, the corner portion of the trench of the conventional semiconductor memory device having trench type memory cells is formed to have a right angle. When a selective oxide film is formed on the bottom surface 25a of the trench 25, the extension of the bird's beak 6a at the end portion of the selective oxide film is suppressed. The reason for this is that the silicon nitride film is hard to be lifted since the direction of the bird's beak extension changed from the horizontal direction to the vertical direction. Consequently, a stress occurs at the corner portion 25c of the trench formed on the single crystal silicon substrate 1, causing a distortion of the crystal lattice at this portion. A leak occurs at the p-n junction formed by the semiconductor substrate 1 and the impurity diffusion layer 8. Therefore, when this trench is applied to the above described dynamic RAM, the refresh for the dynamic RAM should be carried out with intervals shorter than the normal intervals.

SUMMARY OF THE INVENTION

Therefore, an object of the present invention is to provide a semiconductor device and the method for making the same in which the stress due to the oxidation to the semiconductor substrate at the end portion of the the selective oxide film can be eliminated.

Another object of the present invention is to provide a semiconductor device and the method for making the same in which no leak occurs at the p-n junction portion formed by the impurity diffusion layer.

A further object of the present invention is to provide a dynamic type semiconductor memory device and the method for making the same in which the intervals between refreshing are not short.

The above described objects of the present invention can be attained in a trench type semiconductor device with the region for isolation between devices formed by the selective oxide film at the bottom portion or at the side portion of the trench by forming the selective oxide film formed on the corner portion of the trench with a moderate curvature or no curvature.

Briefly stated, the semiconductor device in accordance with the present invention comprises a semiconductor substrate of a first conductivity type having a trench and a main surface, a thick insulating film formed on the bottom portion or on the side wall portion of the trench, a thin insulating film which is connected to the end portion of the thick insulating film and extends in the direction orthogonal to the thick insulating film, and an impurity region of a second conductivity type formed in the semiconductor substrate extending either to the lower portion or to the side portion of the thin insulating film.

Since the semiconductor device is structured as described above, a semiconductor device can be provided in which no stress occurs at the corner portion of the trench.

According to a preferred embodiment, the method for manufacturing the semiconductor device comprises the steps of preparing a semiconductor substrate with a predetermined impurity concentration of a first conductivity type having a main surface and a trench with a curvature large enough not to generate the stress at the corner portion, forming a two-layer film of the oxide film and the nitride film on the main surface of the semiconductor substrate, and on the side portion, corner portion and a portion of the bottom of the trench, forming a region for isolation between devices on the bottom portion of the trench by selective oxidation of the semiconductor substrate, removing the two-layer film of the oxide film and the nitride film, and forming an impurity region of a second conductivity type on the sidewall of the trench. Since the method for manufacturing the semiconductor device comprises the above described steps, the curvature of the bird's beak at the selective oxidation is moderate. The stress due to the oxidation of the semiconductor substrate at the end portion of the selective oxide film hardly occurs. Therefore, a semiconductor device can be provided in which the stress due to the oxidation of the semiconductor substrate can be eliminated.

According to a more preferred embodiment of the present invention, the step of forming the two-layer film of the oxide film and the nitride film in the preferred embodiment comprises the step of forming the same only on the main surface of the semiconductor substrate and on the side portion of the trench.

Since the method for manufacturing the semiconductor memory device comprises the above described steps, the direction of the extension of the bird's beak at the selective oxidation is a definite direction. No stress occurs due to the oxidation of the semiconductor substrate at the end portion of the selective oxide film. Therefore, all disadvantages of the prior art can be eliminated.

According to a further preferred embodiment of the present invention, the method for manufacturing the semiconductor device comprises, besides the steps contained in the above described preferred embodiment, the steps of forming a first impurity region of a second conductivity type on a prescribed region on the main surface and on the sidewall portion of the trench, forming a first conductive layer on the first impurity region of the second conductivity type with an insulating film interposed therebetween, forming a second impurity region of the second conductivity type on the main surface of the semiconductor substrate spaced apart from the first impurity region of the second conductivity type, and forming a second conductive layer on that portion of the main surface of the semiconductor substrate which is sandwiched by the first region of the second conductivity type and the second region of the second conductivity type with an insulating film interposed therebetween, whereby a memory cell of a semiconductor memory device with the devices separated by a selective oxide film is formed.

Since the steps of forming the memory cell of the semiconductor memory device comprises the above described steps, the method for manufacturing a dynamic type semiconductor memory device can be provided in which the intervals between refreshing are not short.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
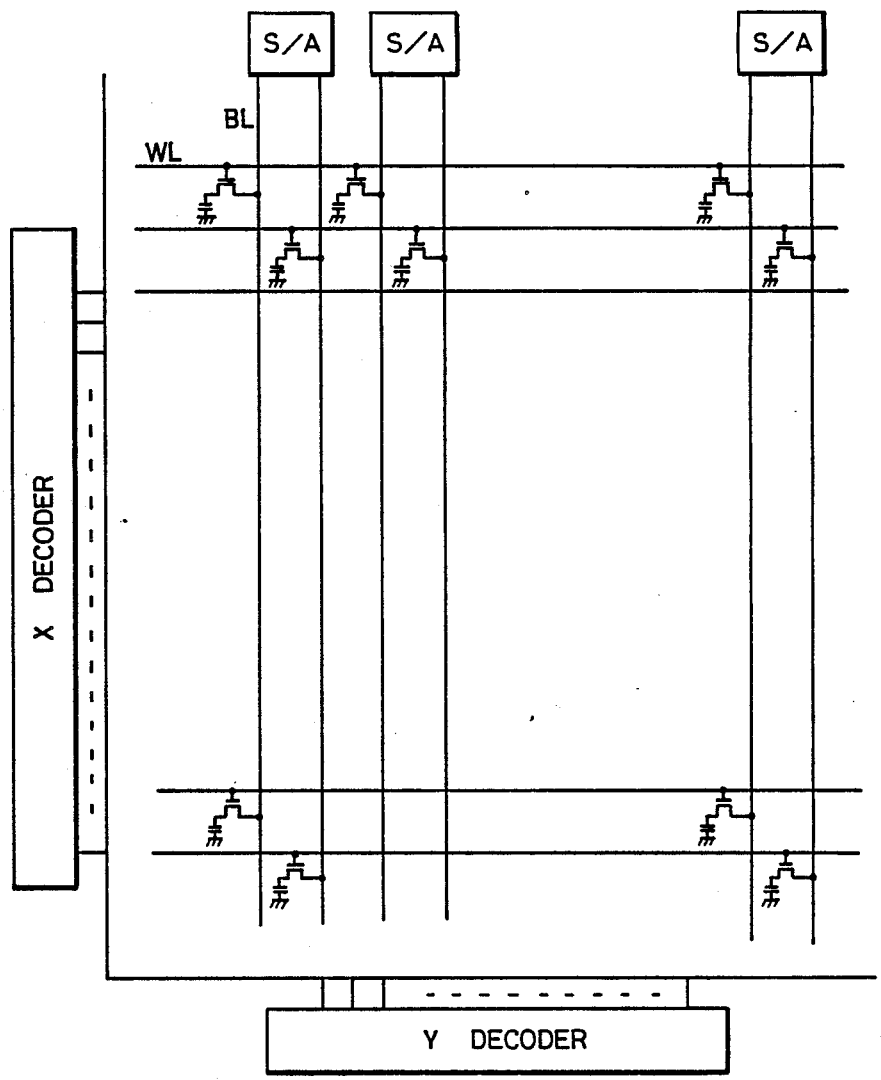
FIG. 1 is a block diagram showing the whole structure of a dynamic semiconductor memory device.
Figure 2:
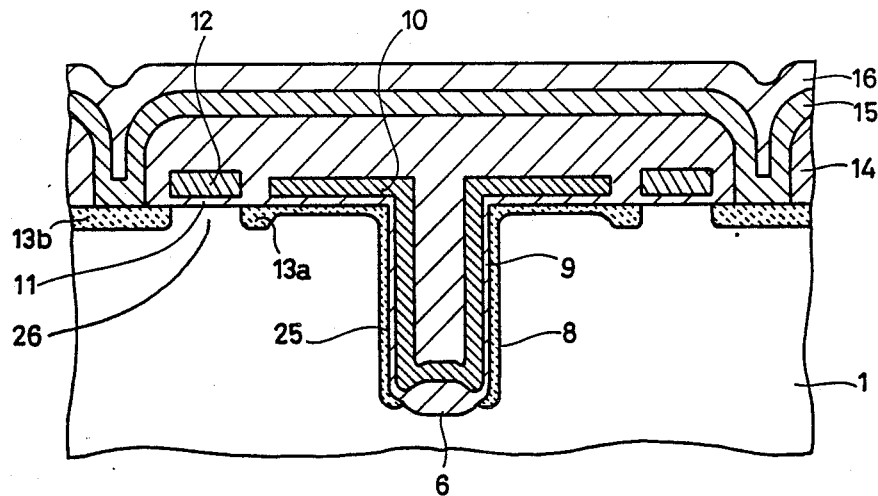
FIG. 2 is a cross sectional view of a conventional memory cell.
Figure 4:
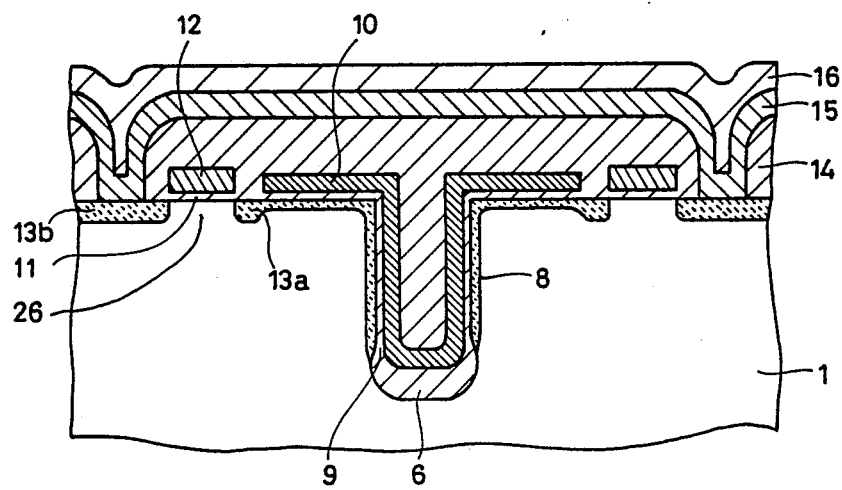
FIG. 4 is a cross sectional view showing the structure of the trench type semiconductor memory device with the semiconductor device of the present invention applied thereto.
Figure 3A:
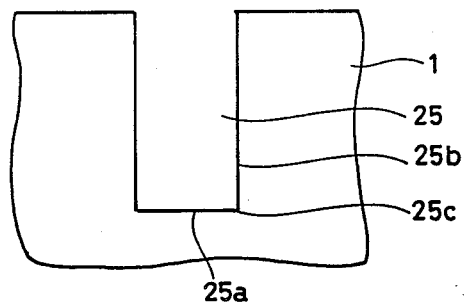
FIGS. 3A, 3B and 3C show the method for manufacturing a film for isolation between devices at the bottom portion of the trench in a conventional trench type dynamic RAM.
Figure 3B:
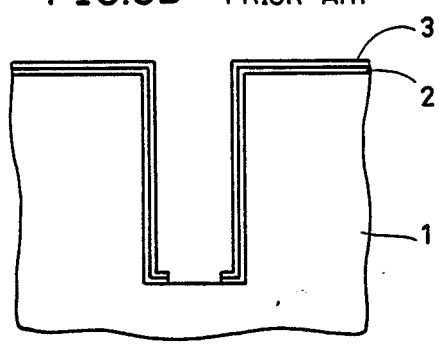
Figure 3C:
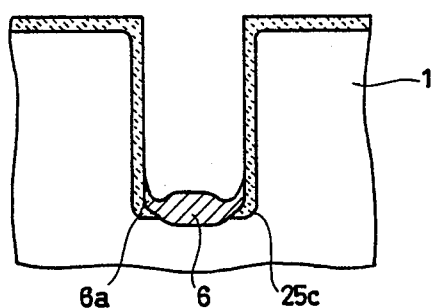

FIG. 4 is a cross sectional view of a trench type semiconductor memory device showing one embodiment of the present invention. FIGS. 5A to 5L show the method for manufacturing the trench type semiconductor memory device of FIG. 4 step by step. Since the main structure of FIG. 4 is similar to that of FIG. 2, the corresponding portions arc denoted by the same reference numerals and the description thereof will be omitted. The structure of FIG. 4 differs from the structure of FIG. 2 in the following point. Namely, the n type impurity region 8 is formed only on the side portion of the insulating film 9 at the sidewall portion of the trench in the structure of FIG. 4. In other words, different from the structure of FIG. 2, the n type impurity region is not formed below the insulating film 9.

In the following, the method for manufacturing the semiconductor memory device shown in FIG. 4 will be described with reference to FIGS. 5A to 5L.

Figure 5A:
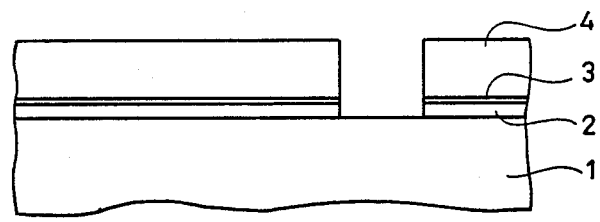
FIGS. 5A to 5L show in the stepwise manner the method for manufacturing the trench type semiconductor memory device in which the method for manufacturing the semiconductor device in accordance with the present invention is applied.
Figure 5B:
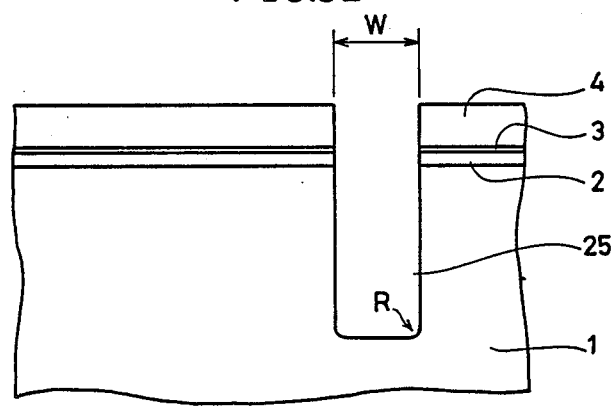
Figure 5C:
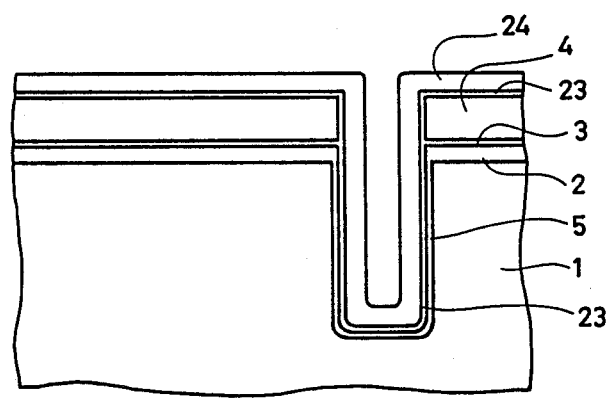
Figure 5D:
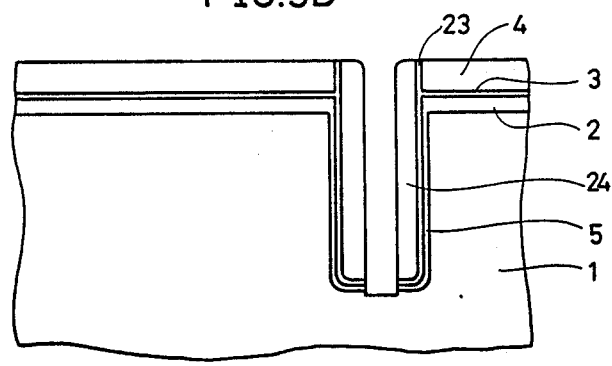
Figure 5E:
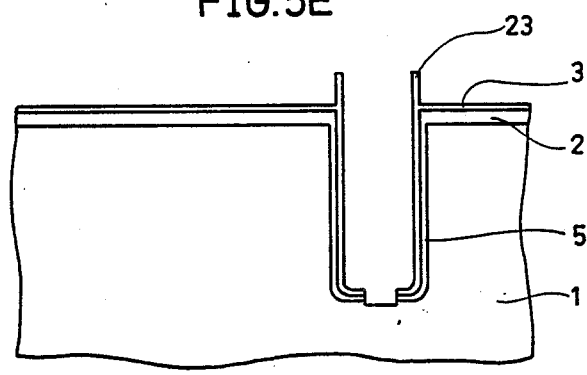
Figure 5F:
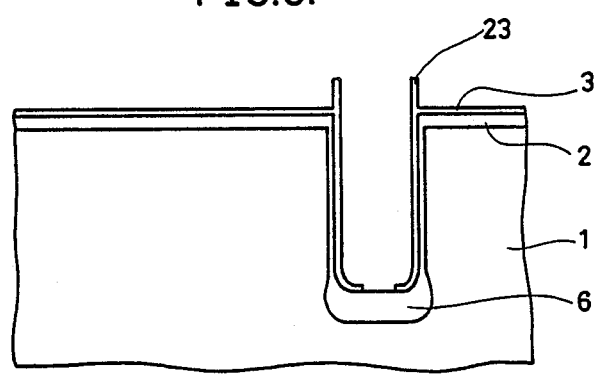
Figure 5G:
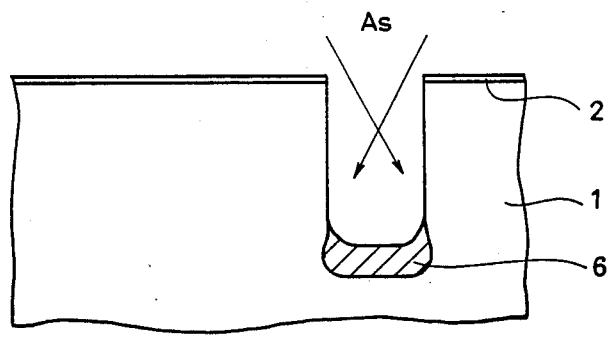
Figure 5H:
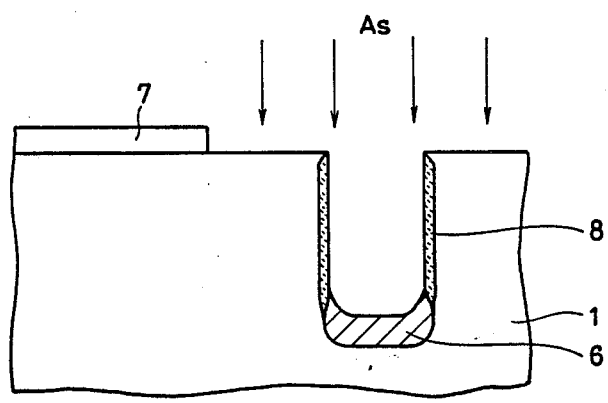
Figure 5I:
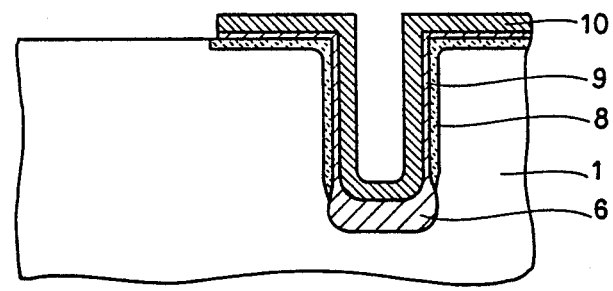
Figure 5J:
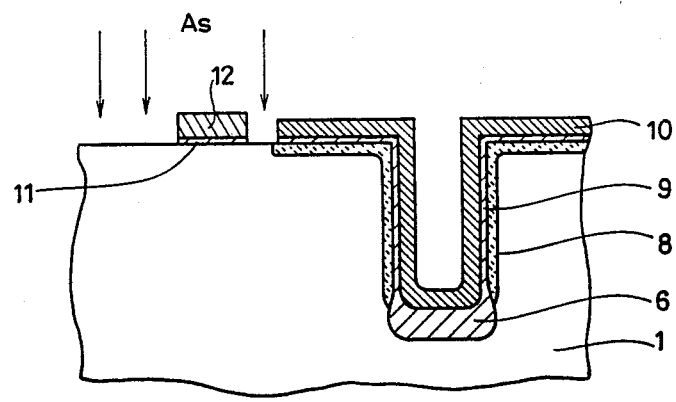
Figure 5K:
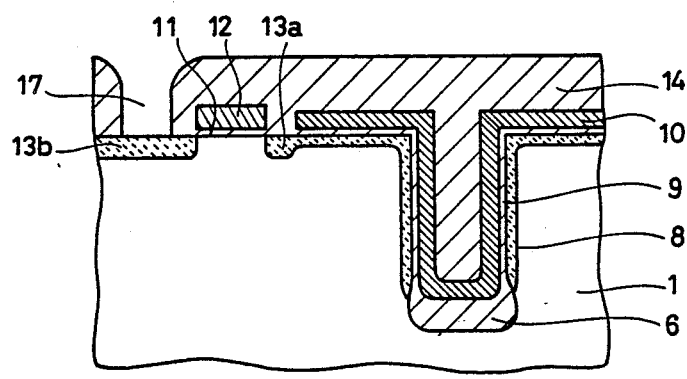
Figure 5L:
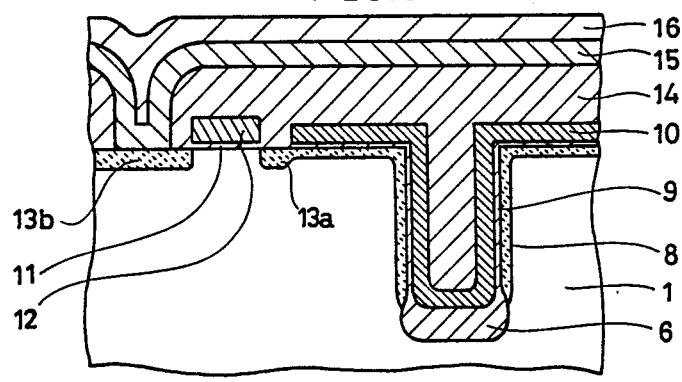

First, a silicon substrate 1 is prepared. A thin silicon oxide film 2 is formed on the main surface of the silicon substrate 1. A thin silicon nitride film 3 is formed on the entire surface of the thin silicon oxide film 2. A thick silicon oxide film 4 is formed on the entire surface of the thin silicon nitride film 3. The silicon substrate is etched using the thick silicon oxide film 4, thin silicon nitride film 3 and the thin silicon oxide film 2 as etching masks (FIG. 5A). Consequently, a trench 25 is formed on the silicon substrate 1, which has a large radius of curvature at the corner portion where the bottom surface and the sidewall surface intersects with each other (FIG. 5B). The curvature of the corner portion of the trench is defined, for example, as follows, $$0.1 \leqq R/W \leqq 0.5$$

$$W \leqq 1.0 (\text{unit}: \mu m)$$

where W: width of the trench
R: radius of curvature of the corner portion
With the silicon oxide film 4 used as the etching mask being left as it is, a second thin silicon oxide film 5 which is thinner than the first thin silicon oxide film 2 is formed on the entire exposed surface of the said silicon substrate. A thin silicon nitride film 23 is formed on the entire surface of the second thin silicon oxide film 5. A thick silicon oxide film 24 is formed on the entire surface of the thin silicon nitride film 23 (FIG. 5C). Anisotropic etching is carried out on the thick silicon oxide film 4 and the thick silicon oxide film 24, and the thin silicon nitride film 23 and the second thin silicon oxide film 5 are left only on the sidewalls of the trench (FIG. 5D). The thick silicon oxide films 24 and 4 are removed by isotropic etching (FIG. 5E). The surface of the silicon substrate 1 which is exposed at the bottom surface of the trench is subjected to thermal oxidation with the thin silicon nitride films 3 and 23 serving as oxidation masks. Consequently, a thick selective silicon oxide film 6 is formed on the bottom surface of the trench (FIG. 5F). The thin silicon nitride films 3 and 23 used as the oxidation masks are removed. The first and second thin silicon oxide films 2 and 5 below the thin silicon nitride films 3 and 23 are etched. As a result, only the first thin oxide film 2 is left on the main surface of the substrate 1. Arsenic is oblique ion implanted into the sidewall of the trench using the first thin silicon oxide film 2 as a mask (FIG. 5G). Consequently, an impurity diffusion layer 8 is formed in the silicon substrate 1 of the trench sidewall. This impurity diffusion layer 8 will be a capacitor electrode. The first thin silicon oxide film 2 is removed. A resist 7 is placed on the prescribed position on the main surface of the silicon substrate 1. Using this as a mask, the arsenic ion implantation is carried out vertically from above to the main surface of the silicon substrate 1 (FIG. 5H). Consequently, an impurity diffusion electrode connected to the impurity diffusion layer 8 at the sidewall portion of the trench is formed on the main surface of the silicon substrate 1. The resist 7 used as a mask for ion implantation is removed. A capacitor dielectric film 9 is formed on the impurity diffusion electrode 8. A capacitor plate electrode 10 is formed on the capacitor dielectric film 9 and on the selective silicon oxide film 6 (FIG. 5I). A gate dielectric film 11 is formed spaced apart from the capacitor plate electrode 10 on the main surface of the silicon substrate 1. A transfer gate electrode 12 is formed on the gate dielectric film 11. Arsenic ion implantation is carried out on the main surface of the silicon substrate 1 using the capacitor plate electrode 10 and the transfer gate electrode 12 as masks. The ion implantation is carried out from above vertical to the main surface (FIG. 5J). Consequently, the impurity diffused regions 13a and 13b which are to be the source and drain are formed on the prescribed regions on the main surface of the silicon substrate 1. This impurity diffusion region 13a is connected to the impurity diffusion electrode 8. The main surface of the silicon substrate 1 is covered with an interlayer insulating film 14. A contact hole 17 is formed at a prescribed position (FIG. 5K). A metal wiring 15 is formed on the interlayer insulating film 14 and is connected to the impurity diffusion layer 13a through a contact hole 17. The metal wiring 15 is a bit line. The bit line 15 is covered with a surface protection film 16.

The foregoing shows one example of the method for manufacturing the semiconductor memory device utilizing the method for manufacturing the semiconductor device of the present inventions. Two memory cells are separated from each other by the selective oxide film formed on the bottom surface of the trench. The corner portion of the trench on which the selective oxide film is formed is not vertical but has a moderate curvature. The two-layer film of the silicon oxide film and the silicon nitride film for forming the selective oxide film is formed along the trench with the moderate curvature. The bird's beak generated at both ends of the selective oxide film extends with a moderate curvature. Therefore, the stress due to the selective oxidation does not occur at the corner portion of the trench. No leak occurs at the p-n junction portion. Consequently, the intervals between refreshing of the dynamic RAM does not become short.

A second embodiment of the method for manufacturing the semiconductor device in accordance with the present invention will be described in the following.

FIGS. 6A to 6J show the method for manufacturing the dynamic RAM utilizing the method for manufacturing the semiconductor device of the present invention.

Figure 6A:
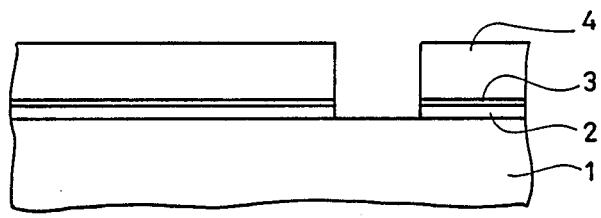
FIGS. 6A to 6J show in the stepwise manner the method for manufacturing the trench type semiconductor device in which another method for manufacturing the semiconductor device in accordance with the present invention is applied.
Figure 6B:
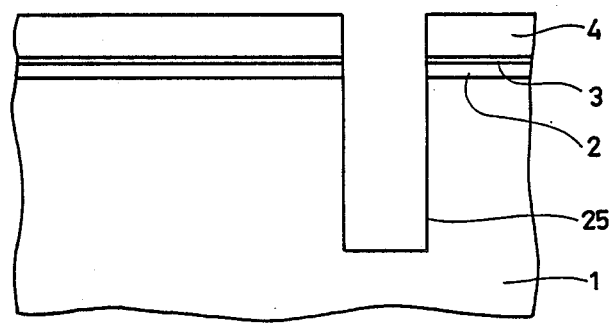
Figure 6C:
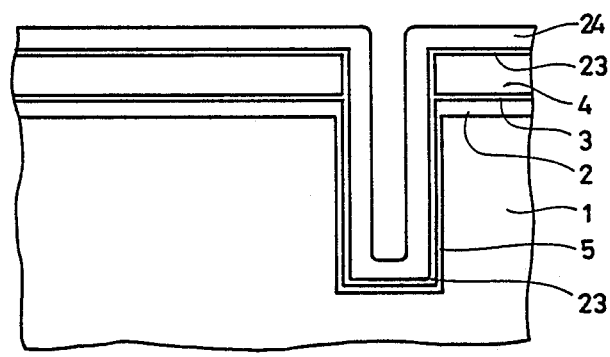
Figure 6D:
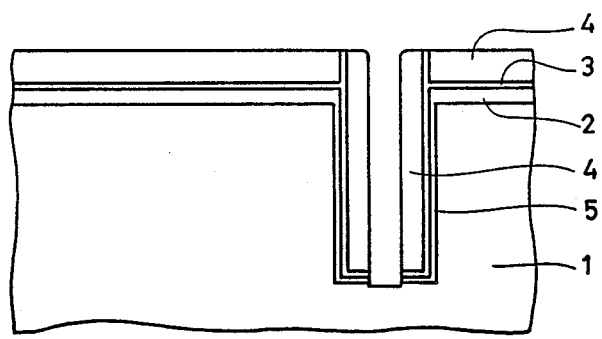
Figure 6E:
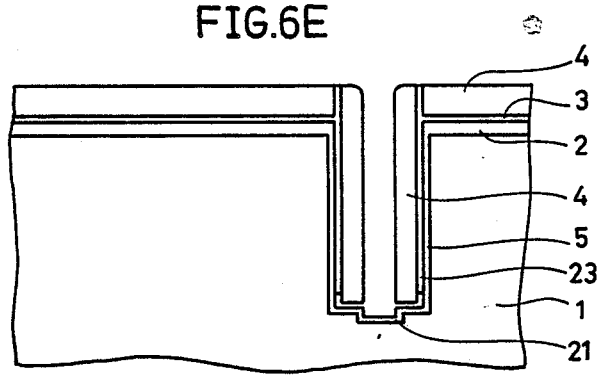
Figure 6F:
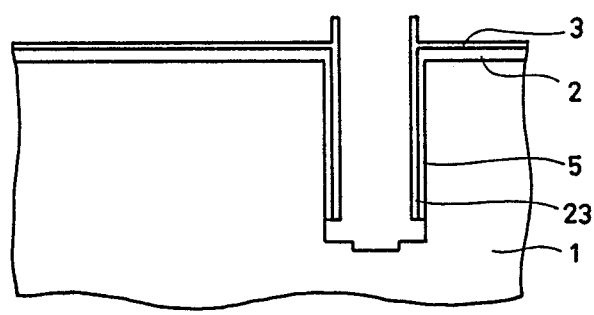
Figure 6G:
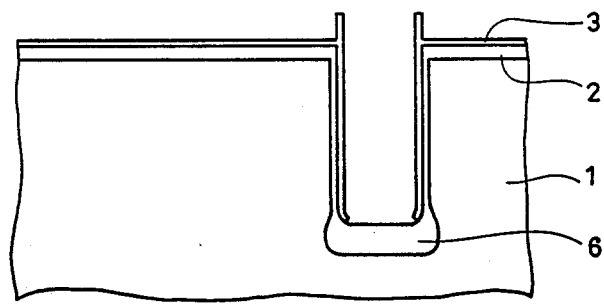
Figure 6H:
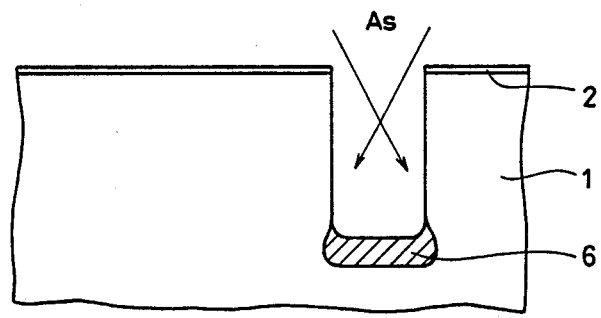
Figure 6I:
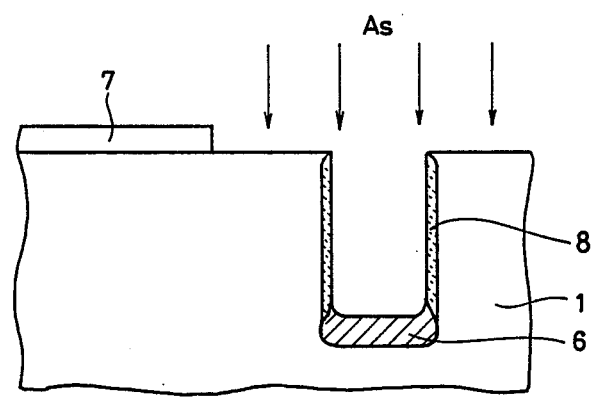
Figure 6J:
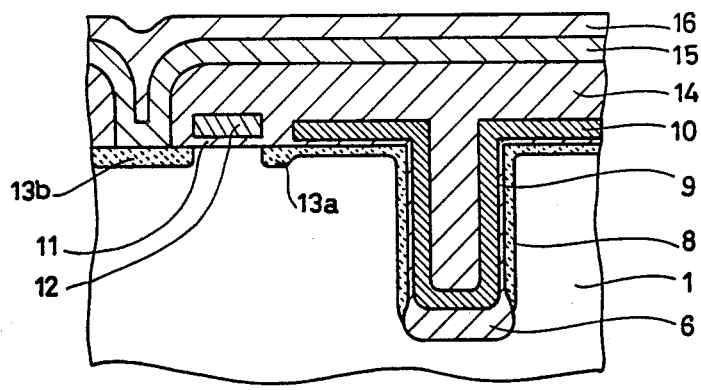

First, a silicon substrate 1 is prepared. A thin silicon oxide film 2 is formed on the main surface of the silicon substrate 1. A thin silicon nitride film 3 is formed on the entire surface of the thin silicon oxide film 2. A thick silicon oxide film 4 is formed on the entire surface of the thin silicon nitride film 3. The silicon substrate 1 is etched using the thick silicon oxide film 4, thin silicon nitride film 3, and the thin silicon oxide film 2 as etching masks (FIG. 6A). Consequently, a trench 25 is formed on the silicon substrate 1. In this case, however, the bottom surface and the sidewall surface of the trench may intersect with each other (FIG. 6B). With the silicon oxide film 4 used as the etching mask being left as it is, a second thin silicon oxide film 5 which is thinner than the first thin silicon oxide film 2 is formed on the entire exposed surface of the said silicon substrate. A thin silicon nitride 23 is formed on the entire surface of the second thin silicon oxide film 5. A thick silicon oxide film 24 is formed on the entire surface of the thin silicon oxide film 13 (FIG. 6C). Anisotropic etching is carried out on the thick silicon oxide film 4 and the thick silicon oxide film 24, thin silicon nitride film 23 and the second thin silicon oxide film 5 are left only on the sidewall of the trench (FIG. 6D). The surface of the silicon substrate 1 exposed on the bottom surface of the trench is subjected to the thermal oxidation. As a result, a thin silicon oxide film 21 is formed on the bottom surface of the trench. The thin silicon nitride film 23 formed on the bottom surface of the trench is etched to the prescribed position from the side surface of the bottom of the trench by isotropic etching (FIG. 6E). The thick silicon oxide film 4 and the thin silicon oxide films 5 and 21 on the bottom surface of the trench are removed by isotropic etching (FIG. 6F). The exposed surface of the silicon substrate 1 in the surface of the bottom of the trench is subjected to the thermal oxidation using the thin silicon nitride film 23 as the oxidation mask. Thick selective silicon oxide film 6 is formed on the bottom surface of the trench (FIG. 6G). The thin silicon nitride films 3 and 23 used as the oxidation masks are removed. The first and second thin silicon oxide films 2 and 5 are etched. Consequently, only the first thin oxide film 2 is left on the main surface of the substrate 1. The following steps of the manufacturing are the same as that shown in Figs. 5G to 5L, so that the description thereof will be omitted.

The foregoing is the second method for manufacturing the dynamic RAM utilizing the method for manufacturing the semiconductor device of the present invention. Two memory cells are separated from each other by a selective oxide film formed on the bottom surface of the trench. The bird's beak formed at both end portions of the selective oxide film extend only in the vertical upper direction along the sidewalls of the trench. Since the direction of the extension of the bird's beak is only one direction, no stress occurs due to the selective oxidation at the corner portion of the trench. No leak occurs at the p-n junction portion. Consequently, the intervals between refreshing the dynamic RAM does not become short.

Figure 7:
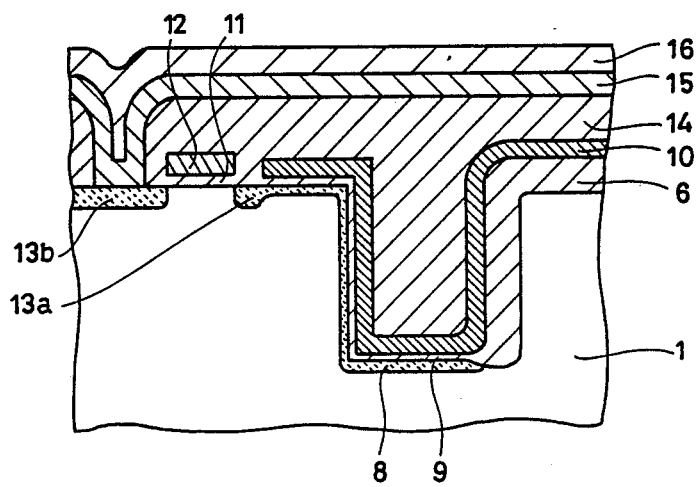
FIG. 7 shows another trench type semiconductor memory device in which the semiconductor device in accordance with the present invention is applied.

In the above described embodiments, the selective oxide film is formed on the bottom portion of the trench and the capacitor of the memory cell is formed on the sidewall of the trench and on a portion of the main surface. The selective oxide film may be formed on the sidewall of the trench and the capacitor may be formed on the bottom surface of the trench. The structure of the trench portion in that case is shown in FIG. 7. Referring to FIG. 7, the selective oxide film 6 formed by selective oxidation is formed on the sidewall portion of the trench of the semiconductor substrate 1.

As described above, according to the present invention, in the semiconductor device with a region for isolation between devices being formed by using a selective oxide film on the bottom portion or side portion of the trench, the selective oxide film formed on the corner portion of the trench has a moderate curvature or no curvature.

Therefore, no stress occurs due to the selective oxidation at the corner portion of the trench. In addition, no leak occurs at the p-n junction when the selective oxide film is formed and an impurity diffusion layer is formed thereon to provide a p-n junction between the semiconductor substrate. In addition, the disadvantages in refreshing can be eliminated when the method for manufacturing the semiconductor device of the present invention is applied to the dynamic RAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate having a main surface, a prescribed impurity concentration of a first conductivity type and a trench;
    a thick insulating film formed on either a bottom portion or a sidewall portion of said trench, an end portion of said thick insulating film extending in either a vertical upward direction when said thick insulating film is formed on the bottom portion or a horizontal direction when the thick insulating film is formed on the sidewall portion;
    a thin insulating film extending in the direction orthogonal to said thick insulating film and connected to the end portion of said thick insulating film; and
    a first impurity region of a second conductivity type formed in said semiconductor substrate on either the sidewall portion or the bottom portion and the sidewall portion of said trench on which said thick insulating film is not formed, only in the side portion or lower portion of said thin insulating film, said thick insulating film is formed by
    forming a two-layer film constituted by an oxide film and a nitride film on the main surface of said semiconductor substrate, side portions and a portion of the bottom portion of the trench, and
    forming a selective oxide film to form said thick insulating film on the bottom portion of the trench of said semiconductor substrate by oxidizing said semiconductor substrate with said two-layer film formed thereon, whereby
    the direction of extension of the end portion of said selective oxide film changing from horizontal to vertical upward with a large curvature.

2. A semiconductor device according to claim 1, wherein
    said first impurity region of the second conductivity type extends to the main surface of said semiconductor substrate along the sidewall of the trench, which further comprises:
    a second impurity region of the second conductivity type formed on a prescribed position on the main surface of said semiconductor substrate and connected to said first impurity region of the second conductivity type;

a first conductive layer formed on said second impurity region of the second conductivity type and on said first impurity region of the second conductivity type with an insulating film interposed therebetween;

a third impurity region of the second conductivity type formed on the main surface of said semiconductor substrate spaced apart from said second impurity region of the second conductivity type; and a second conductive layer formed on that portion of said semiconductor substrate which is sandwiched between said second impurity region of the second conductivity type and said third impurity region of the second conductivity type with an insulating film interpose therebetween.

3. A semiconductor device according to claim 2, wherein said first impurity region of the second conductivity type, said second impurity region of the second conductivity type, said first conductive layer and the insulating film interposed therebetween constitute a capacitor of a memory cell.

4. A semiconductor device according to claim 2, wherein said second impurity region of the second conductivity type, said third impurity region of the second conductivity type and said second conductive layer constitute a field effect device.

5. A semiconductor device according to claim 4, wherein said field effect device comprises a field effect transistor.

6. A semiconductor device according to claim 5, wherein said semiconductor device comprises a semiconductor memory device.

7. A semiconductor device according to claim 1, wherein
said thick insulating film is formed on the bottom portion of said trench,
said thin insulating film is formed on both sidewall portions of said trench,
said first impurity region of the second conductivity type is formed on both sidewall portions of said trench, said device further comprising:
second impurity regions of the second conductivity type formed on a prescribed position of the main surface of said semiconductor substrate and connected to said first impurity regions of the second conductivity type;
first conductive layers formed on said second impurity regions of the second conductivity type and on said first impurity regions of the second conductivity type with insulating films interposed therebetween;
third impurity regions of the second conductivity type formed on the main surface of said semiconductor substrate spaced apart from said second impurity regions of the second conductivity type; and
second conductive layers formed on that portion on the main surface of said semiconductor substrate which are sandwiched between said second impurity regions of the second conductivity type and said third impurity region of the second conductivity type; whereby
said thick insulating film constitutes a region for isolation between devices.

8. A semiconductor device according to claim 7, wherein said first impurity region of the second conductivity type, said second impurity region of the second conductivity type, said first conductive layer and the insulating film interposed therebetween constitute a capacitor of a memory cell.

9. A semiconductor device according to claim 7, wherein said second impurity region of the second conductivity type, said third impurity region of the second conductivity type and said second conductive layer constitute a field effect device.

10. A semiconductor device according to claim 9, wherein said field effect device comprises a field effect transistor.

11. A semiconductor device according to claim 10, wherein said semiconductor device comprises a semiconductor memory device.

12. The semiconductor device according to claim 1, wherein said trench bottom portion is joined to the trench sidewall portion by continuously curvilinear corner portions on which is formed the thick insulating film, said end portion thereby having rounded surfaces where it contacts said continuously curvilinear portions, an inner surface of said insulating film within the trench also having rounded surfaces proximate the end portion to thereby minimize stress in the end portion by preventing distortion of the crystal lattice within the end portion.

13. The semiconductor device according to claim 12, wherein the width of said trench is less than 1ü, and the radius curvature of said corner portion is more than 1/10 and less than ½ of the width of said trench.

14. A semiconductor device comprising:
a semiconductor substrate having a main surface, a prescribed impurity concentration of a first conductivity type and a trench;
a thick insulating film formed on either a bottom portion or a sidewall portion of said trench, and an end portion of said thick insulating film extending in either a vertical upward direction when said thick insulating film is formed on the bottom portion or a horizontal direction when the thick insulating film is formed on the sidewall portion;
a thin insulating film extending in the direction orthogonal to said thick insulating film and connected to the end portion of said thick insulating film; and
a first impurity region of a second conductivity type formed in said semiconductor substrate on either the sidewall portion or the bottom portion and the sidewall portion of said trench on which said thick insulating film is not formed, only in the side portion or lower portion of said thin insulating film, said thick insulating film is formed by:
forming a two-layer film constituted by an oxide film and a nitride film on the main surface of said semiconductor substrate and on that region of the sidewall portion of said trench other than the regions adjacent to the bottom portion of said trench,
forming a selective oxide film to form said thick insulating film on the bottom portion of the trench of said semiconductor substrate by oxidizing said semiconductor substrate with said two-layer film formed thereon with the bottom portion of said trench and the regions of the sidewall portion of said trench adjacent to said bottom portion being exposed, whereby
an end portion of said selective oxide film extending only in the vertical upward direction.

* * * * *